(12) United States Patent
Atanackovic et al.

(10) Patent No.: US 7,365,357 B2
(45) Date of Patent: Apr. 29, 2008

(54) STRAIN INDUCING MULTI-LAYER CAP

(75) Inventors: Petar B. Atanackovic, Palo Alto, CA (US); Michael Lebby, Apache Junction, AZ (US)

(73) Assignee: Translucent Inc., Palo Alto, CA (US)

( * ) Notice: Subject to any disclaimer, the term of this patent is extended or adjusted under 35 U.S.C. 154(b) by 187 days.

(21) Appl. No.: 11/187,213

(22) Filed: Jul. 22, 2005

(65) Prior Publication Data
US 2007/0018203 A1    Jan. 25, 2007

(51) Int. Cl.
*H01L 29/06* (2006.01)

(52) U.S. Cl. .......................... 257/18; 257/28; 257/213; 257/E29.072

(58) Field of Classification Search ................. 257/18, 257/E29.072
See application file for complete search history.

(56) References Cited

U.S. PATENT DOCUMENTS

2005/0199958 A1* 9/2005 Chen et al. ................. 257/368
2005/0224879 A1* 10/2005 Xiang ......................... 257/347
2005/0263825 A1* 12/2005 Frohberg et al. ........... 257/369
2006/0284282 A1* 12/2006 Cunningham ............... 257/565

* cited by examiner

*Primary Examiner*—Tu-Tu Ho
(74) *Attorney, Agent, or Firm*—Parsons & Goltry; Robert A. Parsons; Michael W. Goltry

(57) ABSTRACT

A strained transistor includes a silicon transistor, an encapsulating layer of silicon insulating material with an outer surface, and a stress inducing multilayer cap deposited on the outer surface of the encapsulating layer with at least two layers including a layer of rare earth oxide and a layer including silicon. The stress inducing cap can be designed to provide either compressive strain or tensile strain and virtually any desired amount of strain without producing dislocations, defects, and fractures in the structure.

10 Claims, 2 Drawing Sheets

| FILM | PROCESS | FILM STRESS | FILM STRESS on Si SUBSTRATE |
|---|---|---|---|
| $SiO_2$ | THERMAL | COMPRESSIVE | −0.2 To −0.3 GPA |
| $SiO_2$ | CVD | TENSILE | +0.15 GPA |
| $SiO_2$ | TEOS | TENSILE | +0.38 GPA |
| $Si_3N_4$ | CVD | TENSILE | +0.8 To +1.2 GPA |
| $Si_3N_4$ | PLASMA | COMPRESSIVE | −0.7 GPA |
| $Si_3N_4$ | SPUTTERED | COMPRESSIVE | −0.1 To −0.5 GPA |
| Poly Si | LPCVD | COMPRESSIVE | −0.1 To −0.3 GPA |
| $TiSi_2$ | SPUTTERED | TENSILE | +2.3 GPA |
| $CoSi_2$ | SPUTTERED | TENSILE | +1.3 GPA |
| $TaSi_2$ | SPUTTERED | TENSILE | +1.2 To +3.2 GPA |

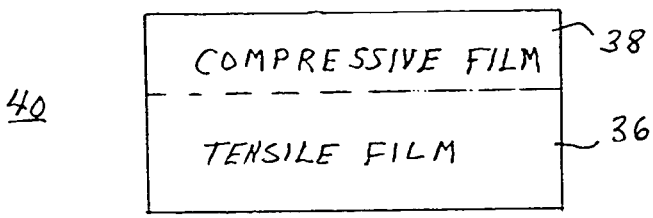

FIG. 2.

STRAIN INDUCING MULTI-LAYER CAP

FIELD OF THE INVENTION

This invention relates to transistors and more specifically to strained transistors.

BACKGROUND OF THE INVENTION

In the semiconductor industry it has recently been discovered that some strain in switching transistors, such as FETs and the like, can actually increase the speed of the transistor. For example it has been found that compressive strain on the channel or active layer of a silicon transistor (i.e. a transistor formed on a silicon substrate), e. g. an MOS transistor, increases the number of available electrons and reduces the number of available holes, which increases the speed. Similarly, a tensile strain on the channel or active layer of a silicon transistor reduces the number of available electrons and increases the number of available holes, which reduces the speed.

In one attempt to increase the speed of transistors, an encapsulation or passivation layer is deposited over the transistor. Germanium is then implanted in the encapsulation layer to create strain in the transistor. The major problem is that the amount of strain is minimal and difficult to accurately adjust. Also, the germanium has a tendency to migrate into the transistor and change the characteristics and reduce the life.

It would be highly advantageous, therefore, to remedy the foregoing and other deficiencies inherent in the prior art.

Accordingly, it is an object of the present invention to provide new and improved strained transistors.

Another object of the invention is to provide new and improved strained transistors with a stress engineered cap layer to produce an active layer with a desired amount of compressive stress, a desired amount of tensile stress, or no stress.

Another object of the invention is to provide new and improved strained transistors that can be formed very easily and with accurately engineered stress.

And another object of the invention is to provide a new and improved method of fabricating strained transistors.

SUMMARY OF THE INVENTION

Briefly, to achieve the desired objects of the instant invention in accordance with a preferred embodiment thereof, provided is a strained transistor including a transistor, an encapsulating layer formed over the transistor, and a stress inducing multilayer cap deposited on the outer surface of the encapsulating layer. The stress inducing multilayer cap includes alternate layers of rare earth oxide and one of silicon and silicon insulating material. Also, the stress inducing cap can be designed to provide either compressive strain or tensile strain and virtually any desired amount of strain without producing dislocations, defects, and fractures in the structure.

To further achieve the desired objects of the instant invention in accordance with a preferred embodiment thereof, provided is a method of fabricating a strained transistor including the steps of providing a transistor, forming an encapsulating layer over the transistor, and depositing a stress inducing multilayer cap on the outer surface of the encapsulating layer. The encapsulating layer is formed with a shape that directs at least a portion of the induced stress along a channel of the transistor, such as generally dome shaped. Also, the stress inducing multilayer cap is designed to induce one of compressive and tensile stress.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 2 is a side view of a pair of stressed insulating layers illustrating some representative stresses that can be incorporated for stress engineering;

DETAILED DESCRIPTION OF A PREFERRED EMBODIMENT

Figure 1:
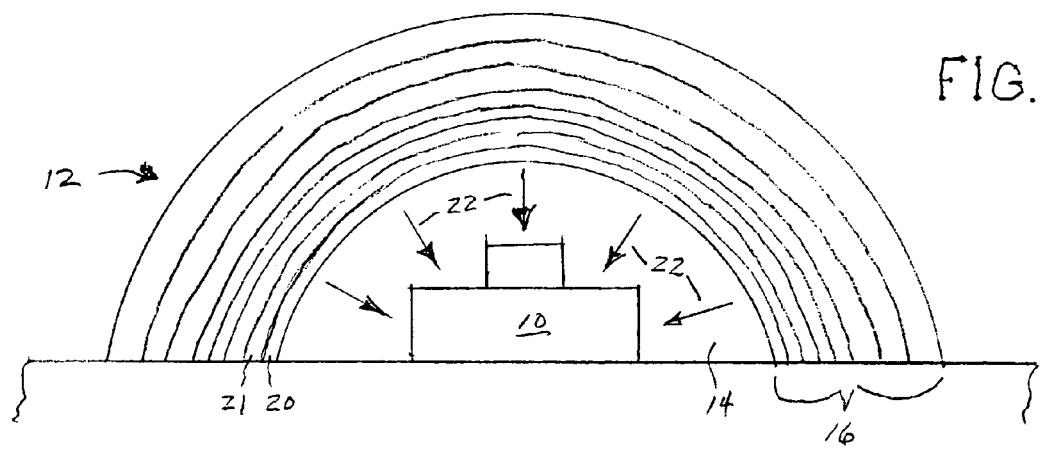
FIG. 1 is a simplified sectional view of a transistor illustrating a strain inducing multi-layer cap in accordance with the present invention.

Turning now to the drawings, attention is first directed to FIG. 1, which illustrates a simplified side view of a transistor 10 with a strain inducing cap 12 thereover. Transistor 10 has an encapsulation or passivation layer 14 deposited thereover in any convenient method. For example, encapsulation layer 14 could be formed of silicon oxide, silicon nitride, or silicon oxynitride or any combination thereof, hereinafter referred to as a 'silicon insulator' or 'silicon insulating material'. Also, encapsulation layer 14 is illustrated as hemispherical or dome shaped for ease of understanding of this description but it will be understood that other shapes might be utilized, depending largely upon the shape of the transistor being strained, the amount and type of strain being induced and any connecting components included. It will be understood that the shape is generally such that at least a portion of the induced strain will be directed along the channel or active layer of transistor 10. Generally, encapsulation layer 14 will be grown as an extension of the fabrication process for transistor 10 and may either be grown in the desired shape, etched, or machined to the final shape.

Multiple layers 16 of silicon, silicon oxides, and rare earth oxides are deposited over the surface of encapsulation layer 14 to provide a desired strain in transistor 10. While eight layers are illustrated in FIG. 1 it should be understood that any number of layers might be utilized from two to as many as are required to produce the desired total stress. Generally, the total strain realized is a function of a number of variables including: the specific material of each layer; type of strain in adjacent layers; the number of layers; the crystalline composition (i.e. the lattice match); and the level of rare earth in the rare earth layers.

In the present embodiment, as a specific example, encapsulation layer 14 is formed of silicon dioxide grown over transistor 10 in a typical thermal process. The dome shape is produced through using minimum well known chemical mechanical polishing (CMP) techniques. A first layer 20 deposited on encapsulation layer 14 is formed of silicon which, because of the amorphous nature of the silicon dioxide of encapsulation layer 14, is amorphous or polycrystalline. A second layer 21 of a rare earth oxide is deposited over silicon layer 20. The rare earth oxide is also amorphous or polycrystalline because of the nature of silicon layer 20. Additional layers in strain inducing cap 12 (e.g. the remaining six layers illustrated) may alternate between silicon and rare earth oxide or may further include layers of silicon insulating material adjacent the silicon layers or instead of the silicon layers. Again, this process can use any standard deposition (growing) procedure to form the silicon insulating material (e.g. CVD, TEOS, plasma, sputtered, etc.), depending upon the specific stress desired.

Some typical examples of rare earth oxides, nitrides, and phosphides that can be used in this application are described in a copending United States patent application entitled "Rare Earth-Oxides, Rare Earth-Nitrides, Rare Earth-Phosphides and Ternary Alloys With Silicon", filed on Dec. 28, 2004, and bearing serial number, which is a conversion of U.S. provisional application No. 60/533,378, filed 29 Dec. 2003 and bearing the same title, incorporated herein by reference. In the present disclosure, the rare earth oxide, nitride, oxynitride, or phosphide layers or films are referred to generically as 'rare earth oxides' for simplicity.

The total amount of stress, either compressive or tensile, in strain inducing cap 12 depends upon the materials used in individual layers 20, 21, etc. of multiple layers 16, the amount of lattice mismatch between adjacent layers, the thickness and content of individual layers, and the process used in forming individual layers. A chart is illustrated as a portion of FIG. 2 to show a few examples of materials that can be used in some of the individual layers of multiple layers 16. The first column of the chart lists materials that can be used in one or more of multiple layers 16. The second column lists the process for forming the materials listed in column one, the third column lists the type of stress developed, and the fourth column lists the amount of stress. It will be noted that three silicides (i.e. $TiSi_2$, $CoSi_2$, and $TaSi_2$) are listed as formed by sputtering but can also be formed using commercial CMOS processes.

Figure 3:
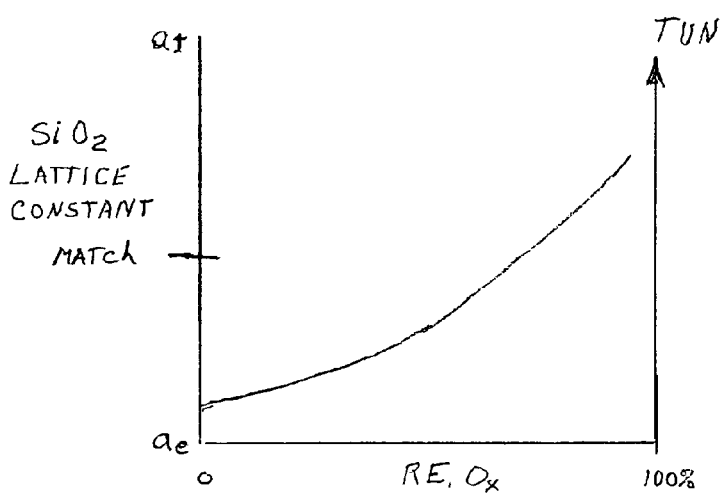
FIG. 3 is a graphical representation of the strain inducing effects of rare earth oxides.

Referring additionally to FIG. 3, an example of strain tuning that can be accomplished with a layer of rare earth oxide on silicon dioxide is illustrated graphically. In this graph the ordinate axis depicts the lattice constant relative to silicon dioxide and the abscissa axis depicts the amount of rare earth in the rare earth oxide. As can be seen from the graph, more rare earth in the oxide gradually changes the stress produced through the lattice mismatch from compressive to tensile.

Thus, by carefully engineering the rare earth oxide layers virtually any desired type and amount of stress can be relatively easily provided. Further, by interspersing layers of silicon or silicon insulating material between layers of rare earth oxides the amount and type of stress can be very accurately formed. Further, because multiple layers of material are used to produce the desired stress in gradual steps, no single interface has so much stress that dislocations, defects, fractures, etc. can occur. The total stress developed in stress inducing cap 12 is directed inwardly, as depicted by arrows 22 in FIG. 1, to directly stress the channel or active layer of transistor 10.

Figure 4:
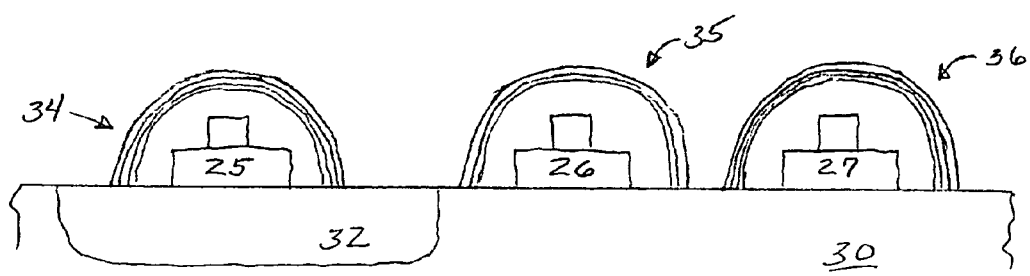
FIG. 4 is a simplified sectional view of a plurality of transistors in circuit with individually engineered stress.

Turning now to FIG. 4, a simplified side view of several transistors in a common circuit is illustrated. For purposes of this example, three transistors 25, 26, and 27 are illustrated on a common substrate 30. To aid in understanding the various possibilities of controlling the stress in transistors, transistor 25 is fabricated on an implanted tub 32 to indicate that it could be a different type of transistor (e.g. a p-n-p as opposed to an n-p-n if other than FETs are being controlled). Each transistor 25, 26, and 27 has a separate strain inducing cap 34, 35, and 36 to illustrate that different amounts of stress can be engineered on each transistor. It will be understood, however, that more than one transistor could be included under a single stress inducing cap if it is desirable to induce the same amount of stress in all of them.

In the simplified example illustrated in FIG. 4, stress inducing cap 34 might be engineered to induce tensile stress in transistor 25 whereby more holes would be available. Also, stress inducing cap 35 might be engineered to induce a first compressive stress in transistor 26 and stress inducing cap 36 might be engineered to induce a second, larger compressive stress in transistor 27. In this example, transistor 27 might be faster than transistor 26 to help coordinate operations within the circuit.

Thus, new and improved strained transistors with a stress engineered cap layer to produce an active layer with a desired amount of compressive stress or a desired amount of tensile stress have been disclosed. Further, the new and improved strained transistors can be formed very easily and with accurately engineered stress. Further, by stress engineering multiple layers, the stress is developed in steps and the overall structure contains less dislocations, defects, fractures, etc.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A strained transistor comprising:
   a silicon transistor;
   an encapsulating layer of silicon insulating material with an outer surface; and
   a stress inducing multilayer cap deposited on the outer surface of the encapsulating layer with at least two layers including a layer of rare earth oxide and a layer including silicon.

2. A strained transistor as claimed in claim 1 wherein the encapsulating layer is formed with a shape that directs at least a portion of the induced stress along a channel of the transistor.

3. A strained transistor as claimed in claim 2 wherein the encapsulating layer is generally dome shaped.

4. A strained transistor as claimed in claim 2 wherein the stress inducing multilayer cap is designed to induce one of compressive and tensile stress.

5. A method of fabricating a strained transistor comprising the steps of:
   providing a transistor;
   forming an encapsulating layer over the transistor, the encapsulating layer having an outer surface; and
   depositing a stress inducing multilayer cap on the outer surface of the encapsulating layer, the multilayer cap being formed of multiple layers of stress inducing material including alternate layers of rare earth oxide and one of silicon and silicon insulating material, the multiple layers being selected to provide a desired total amount of stress on the transistor in gradual steps.

6. A method as claimed in claim 5 wherein the step of providing the transistor includes providing a silicon transistor.

7. A method as claimed in claim 5 wherein the step of forming the encapsulating layer includes forming the encapsulating layer of silicon insulating material.

8. A method as claimed in claim 5 wherein the step of forming the encapsulating layer includes forming the encapsulating layer with a shape that directs at least a portion of the induced stress along a channel of the transistor.

9. A method as claimed in claim 8 wherein the step of forming the encapsulating layer includes forming the encapsulating layer with a generally dome shape.

10. A method as claimed in claim 5 including the step of designing the stress inducing multilayer cap to induce one of compressive and tensile stress.

* * * * *